United States Patent
Hada et al.

[11] Patent Number: 6,030,894
[45] Date of Patent: Feb. 29, 2000

[54] METHOD FOR MANUFACTURING A SEMICONDUCTOR DEVICE HAVING CONTACT PLUG MADE OF SI/SIGE/SI

[75] Inventors: Hiromitsu Hada; Toru Tatsumi; Naoki Kasai; Hidemitsu Mori, all of Tokyo, Japan

[73] Assignee: NEC Corporation, Tokyo, Japan

[21] Appl. No.: 09/119,541

[22] Filed: Jul. 20, 1998

Related U.S. Application Data

[62] Division of application No. 08/984,214, Dec. 3, 1997, Pat. No. 5,909,059.

[30] Foreign Application Priority Data

Dec. 4, 1996 [JP] Japan ................................. 8-323817

[51] Int. Cl.⁷ ...................... H01L 21/4763; H01L 21/44; H01L 21/31
[52] U.S. Cl. ................ 438/675; 438/647; 438/657; 438/659; 438/660; 438/674; 438/763; 438/796; 257/742; 257/743; 257/748
[58] Field of Search ............................... 438/675, 674, 438/647, 657, 659, 660, 763, 764, 796, 797; 257/742, 743, 748

[56] References Cited

U.S. PATENT DOCUMENTS

| | | | |
|---|---|---|---|
| 5,399,511 | 3/1995 | Taka et al. | 438/312 |
| 5,461,250 | 10/1995 | Burghartz et al. | 257/365 |
| 5,561,326 | 10/1996 | Ito et al. | 257/751 |
| 5,633,179 | 5/1997 | Kamins et al. | 438/318 |
| 5,895,948 | 4/1999 | Mori et al. | 257/306 |

FOREIGN PATENT DOCUMENTS

4221821 8/1992 Japan ...................... H01L 21/28

*Primary Examiner*—John F. Niebling
*Assistant Examiner*—Ha Tran Nguyen
*Attorney, Agent, or Firm*—Hayes Soloway Hennessey Grossman & Hage PC

[57] ABSTRACT

On a main surface of a silicon substrate of one conductivity type, a diffusion layer of the opposite conductivity type is formed, and the main surface of the silicon substrate is covered by an insulator film. The insulator film is formed with a contact hole which extends to reach the diffusion layer of the opposite conductivity type. A contact plug is provided in the contact hole. The contact plug fills the contact hole and comprises a first silicon layer of the opposite conductivity type directly connected to the diffusion layer of the opposite conductivity type, a silicon-germanium alloy layer of the opposite conductivity type directly contact to the first silicon layer, and a second silicon layer of the opposite conductivity type directly contact to the silicon-germanium alloy layer. Wiring is provided on the surface of the insulator film in direct contact to the contact plug. As a result, increase in leakage at the junction of the diffusion layer is prevented by the low-resistance contact plug including the silicon-germanium alloy.

7 Claims, 8 Drawing Sheets

METHOD FOR MANUFACTURING A SEMICONDUCTOR DEVICE HAVING CONTACT PLUG MADE OF SI/SIGE/SI

This is a divisional of application Ser. No. 08/984,214 filed on Dec. 3, 1997, now U.S. Pat. No. 5,909,059.

BACKGROUND OF THE INVENTION

1. Field of the Invention

The present invention relates to a semiconductor device having a contact plug and a method for manufacturing the same and, more particularly, to a conductive layer such as a contact plug for connecting a diffusion layer and wiring.

2. Description of the Related Art

Recent progress of semiconductor techniques has resulted in a trend toward semiconductor devices designed in finer dimensions with a contact hole having a larger aspect ratio. For this reason, techniques that accommodate a contact hole having a large aspect ratio have become important. One of such technique is to fill a contact hole with a contact plug. Such a contact plug must fill a contact hole with preferable step coverage and must further reduce resistance.

A polycrystalline silicon layer added with conductive impurity is frequently used as a material for forming a contact plug of a conventional semiconductor device. For example, this process is carried out as follows. A contact hole is formed in an insulating film so as to extend to reach the source or drain region formed at the surface of a semiconductor substrate of a MOS transistor and, thereafter, a polysilicon film is formed on the entire surface. This polysilicon film is etched back to leave the polysilicon film only in the contact hole. Ion implantation of conductive impurity is carried out and an annealing is performed to diffuse and activate the impurity, thereby completing the contact plug. However, in the case of a contact hole having a large aspect ratio, it has been difficult to dope the contact plug down to the bottom thereof sufficiently by such a process and it has not been easy to provide a contact plug having low resistance.

As a method for solving such a problem, for example, Japanese Patent Application Laid-Open Public No. H4-221821 discloses a method of filling a contact hole having a large aspect ratio with a contact plug which is formed of a layer of a silicon-germanium alloy formed using selective growth.

Figure 1A:
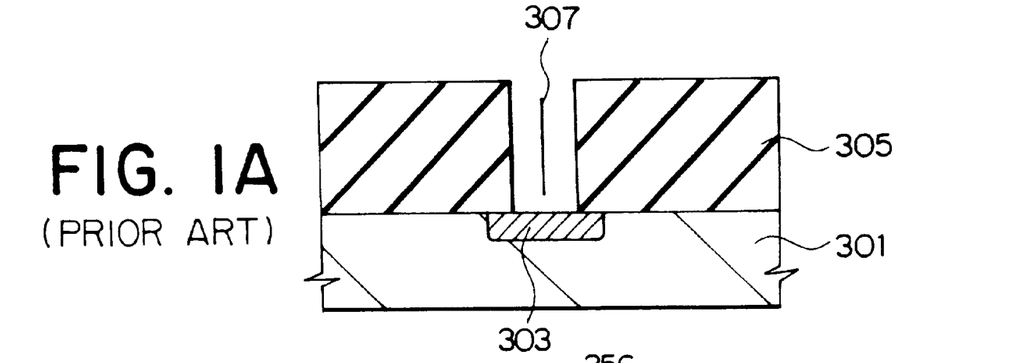
FIGS. 1A through 1D are sectional views showing a conventional method for manufacturing a semiconductor device in the sequential order of the steps.

FIGS. 1A through 1D are sectional views showing steps of the conventional method for manufacturing a semiconductor device disclosed in the above-mentioned patent publication in the order of they are carried out. As shown in FIG. 1A, an n-type diffusion layer 303 is firstly formed at the surface of a p-type silicon substrate 301, and an insulator film 305 is formed so as to cover the entire surface. Anisotropic etching is performed on the insulator film 305 to form a contact hole 307 having a large aspect ratio which reach the n-type diffusion layer 303.

Figure 1B:
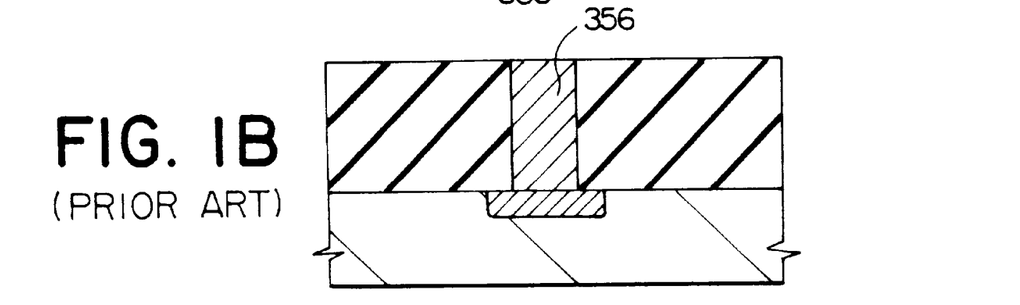

Next, as shown in FIG. 1B, a silicon-germanium alloy layer 356 is formed using a process of selective growth to fill the contact hole 307.

Figure 1C:
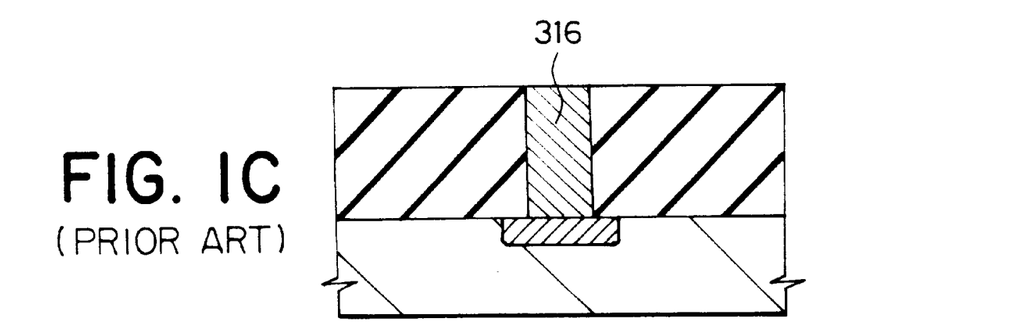

Then, as shown in FIG. 1C, phosphorus ions are implanted in a high dose and an annealing is performed to change the silicon-germanium alloy layer 356 into an n-type silicon-germanium alloy layer 316.

Figure 1D:
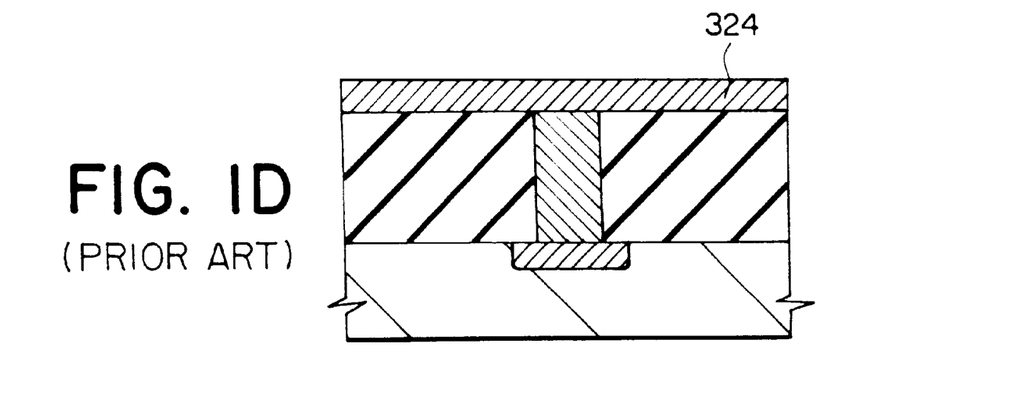

Thereafter, as shown in FIG. 1D, wiring 324 is formed on the surface of the insulator film 305 so as to be directly contacted to the upper surface of the silicon-germanium alloy layer 316.

The resistance of the contact plug disclosed in the above-mentioned patent publication is surely lower than a contact plug formed of polycrystalline silicon. However, for example, when the depth of the junction to the n-type diffusion layer is small, crystalline distortion at the interface between the silicon-germanium alloy layer directly contacted to the diffusion layer and the single crystal silicon substrate is caused because of a mismatch of lattice constants at the interface. By the crystal distortion, an increase in leakage current at the p-n junction is caused.

There is another problem associated with processes for manufacturing a conventions semiconductor device with a silicon substrate. Since the upper surface of the silicon-germanium alloy layer is exposed at the upper end of the contact hole, dissociation of germanium occurs at a photo-lithography step and the like and this can cause deterioration of the characteristics of a semiconductor device with a silicon substrate. The silicon-germanium alloy layer is not compatible with manufacturing lines for normal semiconductor devices with a silicon substrate.

SUMMARY OF THE INVENTION

It is an object of the present invention to provide a semiconductor device having a contact plug which can reduce leakage current at the p-n junction and can avoid contamination of the manufacturing line and which can reduce the resistance of the contact plug and a method for manufacturing the same.

It is another object of the present invention to provide a semiconductor device having a contact plug which allows the aspect ratio of a contact hole to be effectively reduced and a method for manufacturing the same.

It is still another object of the present invention to prevent any increase in leakage current at the junction between a low-resistance contact plug including a silicon-germanium alloy and a diffusion layer.

According to a first aspect of the present invention, there is provided a semiconductor device having a contact plug. Said semiconductor device comprises a silicon substrate of one conductivity type, a diffusion layer of the opposite conductivity type formed on a main surface of the silicon substrate, an insulator film covering the main surface of said silicon substrate, a contact hole provided in said insulator film such that it reaches said diffusion layer of the opposite conductivity type, a contact plug provided in said contact hole, and wiring provided on the surface of said insulator film in direct contact to said contact plug. Said contact plug has a first silicon layer of the opposite conductivity type filled in said contact hole and directly contact to said diffusion layer of the opposite conductivity type, a silicon-germanium alloy layer of the opposite conductivity type directly contact to said first silicon layer, and a second silicon layer of the opposite conductivity type directly contact to said silicon-germanium alloy layer.

A method for manufacturing a semiconductor device having a contact plug comprising the steps of: forming a diffusion layer of the opposite conductivity type in a predetermined region of a main surface of a silicon substrate of one conductivity type; forming an insulator film covering the entire surface; forming a contact hole extending in said insulator film to reach said diffusion layer of the opposite conductivity type; selectively forming a first silicon layer of the opposite conductivity type on the surface of said diffusion layer of the opposite conductivity type exposed on the bottom of said contact hole in-situ using selective growth; selectively forming a silicon-germanium alloy layer of the opposite conductivity type in-situ on the upper surface of said first silicon layer in said contact hole using selective growth; selectively forming a second silicon layer of the opposite conductivity type in-situ on the upper surface of said silicon-germanium alloy layer in said contact hole using selective growth; and forming wiring directly contact to the upper surface of said second silicon layer on a surface of said insulator film.

According to a second aspect of the present invention, there is provided a semiconductor device having a contact plug comprising: a silicon substrate of one conductivity type having a main surface of {100}; an active region defined by sides in a <110>-direction provided on said main surface of said silicon substrate; a field oxide film provided in an element separation region of the main surface of said silicon substrate such that it surrounds said active region; a gate oxide film provided on the surface of said active region; a gate electrode extending across the surface of said active region in the <110>-direction through said gate oxide film; a silicon oxide film cap directly covering the upper surface of said gate electrode; a silicon oxide film spacer directly covering sides of said gate electrode and said silicon oxide film cap; a source/drain region of the opposite conductivity type; an interlayer insulator film covering said field oxide film, silicon oxide film cap, silicon oxide film spacer and second silicon layer; a contact hole provided in said interlayer insulator film extending to reach the upper surface of said second silicon layer; and wiring provided on the surface of said interlayer insulator film in connection to said source/drain region through said contact hole.

Said source/drain region comprises a diffusion layer of the opposite conductivity type provided on the surface of said active region in self-alignment with said gate electrode and said field oxide film, a first silicon layer of single-crystals of the opposite conductivity type directly covering the surface of said silicon oxide film spacer and said diffusion layer of the opposite conductivity type in self-alignment with said field oxide film and having an upper surface whose main surface comprises a {100}-plane, a silicon-germanium alloy layer of single-crystals of the opposite conductivity type directly covering the upper surface of said first silicon layer and having a side surface of {110}-plane and an upper surface whose main surface has {100}-plane, and a second silicon layer of the opposite conductivity type directly covering the upper surface and side surface of said silicon-germanium alloy layer and extending at least on to the upper surface of said silicon oxide film cap and said field oxide film;

A method for manufacturing a semiconductor device having a contact plug comprises the steps of: forming a field oxide film in an element separation region surrounding an active region defined by sides in a <100>-direction on a main surface of a {100} plane of a silicon substrate of one conductivity type; forming a gate oxide film on the surface of said active region using thermal oxidation; forming a conductive film on the entire surface; forming a silicon oxide film covering the surface of said conductive film; patterning said silicon oxide film and conductive film to form a gate electrode extending across the surface of said active region in the <110>-direction through said gate oxide film and a silicon oxide film cap directly covering the upper surface of said gate electrode; forming a diffusion layer of the opposite conductivity type on the surface of said active layer using said gate electrode and said field oxide film as a mask; forming a second silicon oxide film on the entire surface; etching back said second silicon oxide film by anisotropic etching to form a silicon oxide film spacer directly covering sides of said silicon oxide film cap and gate electrode; removing said gate oxide film in self-alignment with said silicon oxide film spacer and field oxide film; forming a first silicon layer of the opposite conductivity type in situ on the surface of said diffusion layer of the opposite conductivity type using anisotropic selective epitaxial growth of single crystal silicon; forming a silicon-germanium alloy layer of the opposite conductivity type in-situ directly covering at least the upper surface of said first silicon layer using anisotropic selective hetero-epitaxial growth of single crystal silicon-germanium; forming a second silicon layer of the opposite conductivity type in situ directly covering at least the upper surface and side surface of said silicon-germanium alloy layer using isotropic selective hetero-epitaxial growth of single crystal silicon or selective growth of polycrystalline silicon; and forming an interlayer insulator film on the entire surface, forming a contact hole extending in said interlayer insulator film to reach said second silicon layer; forming wiring on the surface of said interlayer insulator film in connection to said second silicon layer through said contact hole.

Referring to a contact plug according to a first aspect of the invention, for example, a contact plug for a contact hole which extends to reach an n-type diffusion layer is formed by a first n-type silicon layer, a high concentration n-type silicon-germanium alloy layer and a second n-type silicon layer, and a means is provided to form the first and second silicon layers with a high concentration. This makes it easy to provide a low-resistance contact plug without causing any increase in leakage current at the junction to the n-type diffusion layer. Further, since the silicon-germanium alloy layer is covered by the second silicon layer, compatibility with normal semiconductor device manufacturing lines can be obtained.

According to a second aspect of the invention, a first silicon layer of single crystal is grown on a diffusion layer of a MOS transistor by a self-alignment basis using anisotropic selective epitaxy; a single crystal silicon-germanium alloy layer is grown by an anisotropic selective hetero-epitaxial basis; and a second silicon layer is further formed using isotropic selective growth. As a result, in addition to the effect provided by the first aspect of the invention, it is easy to reduce the aspect ratio of a contact hole relative to a diffusion layer effectively.

DETAILED DESCRIPTION OF PREFERRED EMBODIMENTS

Preferred embodiments of the present invention will now be described with reference to the accompanying drawings.

A first embodiment of the present invention relates to a contact plug for filling a contact hole having a large aspect ratio that extends to reach a diffusion layer formed at a main surface of a silicon substrate. This contact plug is formed by a first silicon layer, a silicon-germanium alloy layer and a second silicon layer stacked on one another. The conductivity type of the first silicon layer, silicon-germanium alloy layer and second silicon layer is the same as that of the diffusion layer, and they are added with impurities at a high concentration.

FIGS. 2A through 2D are sectional views showing steps of a method for manufacturing a semiconductor device according to the first embodiment of the invention in the sequential order of the steps.

Figure 2A:
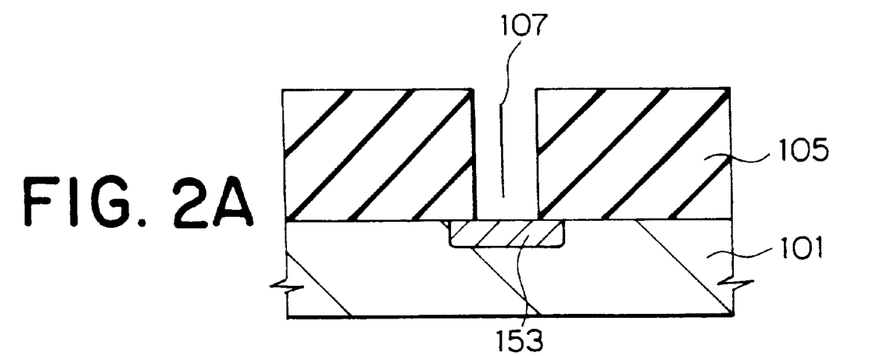
FIGS. 2A through 2D are sectional views showing a method for manufacturing a semiconductor device according to a first embodiment of the invention in the sequential order of the steps.

First, as shown in FIG. 2A, an n-type diffusion layer 153 is formed in a predetermined region of a main surface of a p-type silicon substrate 101. The depth of the junction of the n-type diffusion layer 153 is about 0.1 $\mu$m. A CVD process is performed to form an insulator film 105 having a thickness of about 0.5 $\mu$m on the entire surface. A photolithography step using anisotropic etching is carried out to form a contact hole 107 in the insulator film 105 such that it extends to reach the n-type diffusion layer 153. The diameter of the contact hole 107 is about 0.2 $\mu$m.

Figure 2B:
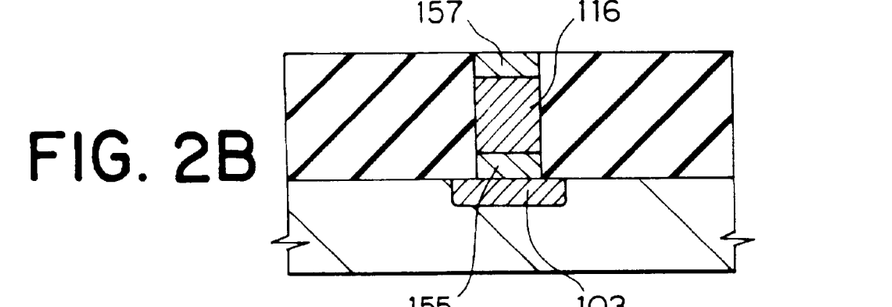

Thereafter, as shown in FIG. 2B, phosphorus ions are implanted in a dose of about $10^{15}$ cm$^{-2}$ through the contact hole 107 using, for example, the insulator film 105 as a mask. As a result, the impurity concentration of at least the n-type diffusion layer 153 exposed at the bottom of the contact hole 107 is increased, and thus the n-type diffusion layer 153 is converted into an n$^+$-type diffusion layer 103.

Next, any natural oxide film on the surface of the n-type diffusion layer 103 is removed using an ultra high vacuum chemical vapor deposition (UHV-CVD) apparatus on the order of $10^{-7}$ Pa and, thereafter, selective epitaxial growth of single crystal silicon is performed under a pressure in the range of $5 \times 10^{-4}$ Pa to $1 \times 10^{-1}$ Pa at a substrate temperature of, for example, 600° C. using monosilane (SiH$_4$) or disilane (Si$_2$H$_6$) as a raw material gas and phosphine (PH$_3$) as an additive gas. As a result, an n-type single crystal silicon layer 155 having a thickness of about 50 nm in direct connection with the n$^+$-type diffusion layer 103 is formed on the bottom of the contact hole 107. The impurity (phosphorus) concentration of the n-type single crystal silicon layer 155 is on the order of $1 \times 10^{19}$ cm$^{-3}$ at the maximum. When phosphorus is introduced in the single crystal silicon layer during the epitaxial growth in-situ, since phosphorus has a property of segregating at the surface, it is difficult to obtain an n-type single crystal silicon layer having a concentration higher than $1 \times 10^{19}$ cm$^{-3}$. At this point, the substrate temperature is preferably in the range of 550° C. to 800° C., and a substrate temperature below 550° C. results in epitaxial growth at a low speed, which reduces productivity. A substrate temperature above 800° C. makes it difficult to add impurities to the single crystal silicon layer and hence to obtain an n-type single crystal silicon layer. Further, selective growth occurs at a pressure within the above-described range.

Next, a single crystal silicon-germanium alloy is grown by a selective hetero-epitaxial basis using the same UHV-CVD apparatus under a pressure in the range of $1 \times 10^{-2}$ Pa to $1 \times 10^{-3}$ Pa at a substrate temperature of, for example, 600° C. with monosilane (SiH$_4$) or disilane (Si$_2$H$_6$) and monogermane (GeH$_4$) serving as raw material gases and phosphine (PH$_3$) serving as an additive gas. As a result, an n-type single crystal silicon-germanium alloy layer 116 having a thickness of about 350 nm is formed on the n-type single crystal silicon layer 155 by a selective hetero-epitaxial basis. The impurity concentration of the n-type single crystal silicon-germanium alloy layer 116 is on the order of $1 \times 10^{20}$ cm$^{-3}$.

A silicon germanium alloy is an eutectic alloy in which some of lattice points of single crystal silicon that form a diamond structure are replaced by germanium atoms. Since the lattice constant of a germanium atom is about 4% larger than that of a silicon atom, it can be grown on the surface of the single crystal silicon layer by a hetero-epitaxial basis. Since the lattice constant of a germanium atom is larger than that of a silicon atom, the n-type single crystal silicon-germanium alloy layer 116 has a lattice distortion greater than that in the n-type single crystal silicon layer 155. As a result, the n-type single crystal silicon-germanium alloy layer 116 is easier for conductive impurities such as phosphorus to penetrate and hence will have an impurity concentration higher than that of the n-type single crystal silicon layer 155.

Further, an n-type single crystal silicon layer 157 having a thickness of about 100 nm in direct contact to the upper surface of the n-type single crystal silicon-germanium alloy layer 116 is formed by the above-described UHV-CVD apparatus according to the same method as for the n-type single crystal silicon layer 155. The upper surface of the n-type single crystal silicon layer 157 is substantially aligned with the upper surface of the insulator film 105.

Figure 2C:
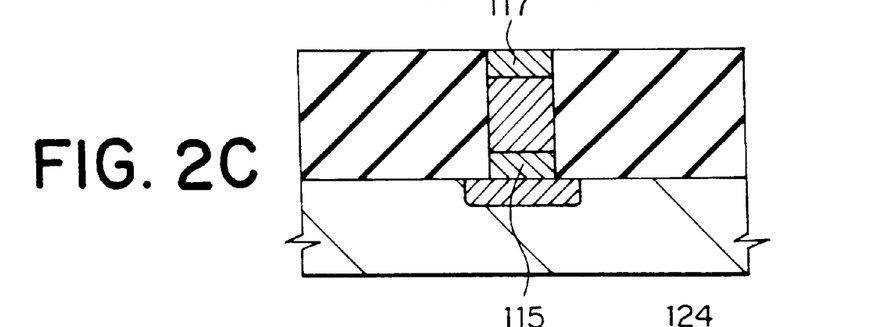

Next, as shown in FIG. 2C, phosphorus ions are implanted under conditions of 30 keV to 60 kev and $1 \times 10^{15}$ cm$^{-2}$ to $1 \times 10^{16}$ cm$^{-2}$, and an annealing is performed further for 10 minutes in, for example, a nitrogen atmosphere at 800° C. The n-type single crystal silicon layers 155 and 157 respectively become n-type single crystal silicon layers 115 and 117 having an impurity concentration of the order of $10^{20}$ cm$^{-3}$. The increase in the impurity concentration of the n-type single crystal silicon layer 155 is attributable to thermal diffusion of phosphorus from the n-type diffusion layer 103.

Figure 2D:
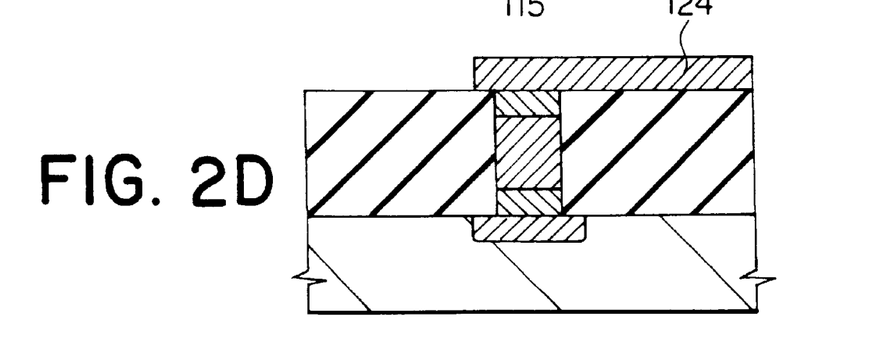

Next, as shown in FIG. 2D, wiring 124 is formed on the surface of the insulator film 103 using a known method of manufacture.

In this first embodiment, the upper surface of the n-type single crystal silicon-germanium alloy layer 116 is not exposed because it is covered by the n-type single crystal silicon layer 117. Thus, the present embodiment has compatibility with manufacturing lines for normal semiconductor devices comprising a silicon substrate because it does not result in contamination of such lines. When the n-type single crystal silicon-germanium alloy layer 116 is formed at a substrate temperature of about 800° C., the formation of this layer will be accompanied by conversion of the n-type single crystal silicon layer 155 into an n-type single crystal silicon layer 115. Further, by providing a mechanism for rapid heating in the above-described UHV-CVD apparatus, rapid thermal annealing (RTA) can be performed, for example, for 10 sec. to 1 minute at 1000° C. in the same apparatus after the formation of the n-type single crystal silicon layer 155 to convert the same into the n-type single crystal silicon layer 115 in the same apparatus.

Figure 3:
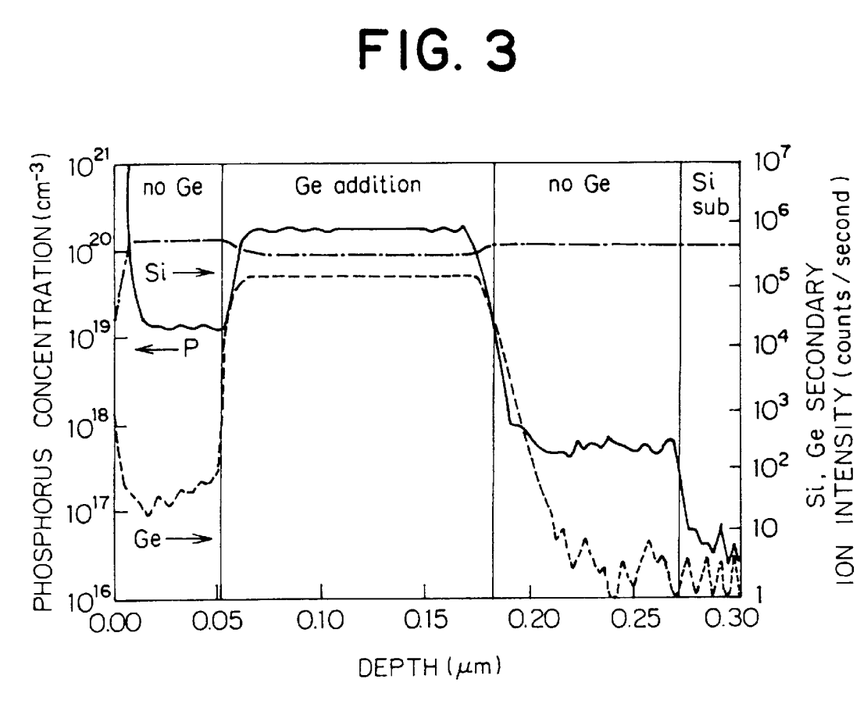
FIG. 3 is a graph showing distributions of concentration of phosphorus, silicon and germanium in a contact plug.

The first embodiment will be described further with reference to FIG. 3 showing a profile obtained by SIMS.

The sample for measurement is prepared as follows. First, an undoped first single crystal silicon layer is formed in-situ on a main surface of a p-type silicon substrate formed with no diffusion layer at a substrate temperature of 600° C. using the above-described UHV-CVD apparatus; then, an n-type single crystal silicon-germanium alloy layer is formed in-situ; and finally a second n-type single crystal silicon layer is formed in-situ. The thickness of the first single crystal silicon layer is about 90 nm; the thickness of the single crystal silicon-germanium alloy layer is about 138 nm; the impurity concentration of phosphorus is about $1 \times 10^{20}$ cm$^{-3}$; the composition of germanium is about 5 atomic %. The thickness and phosphorus impurity concentration of the second single crystal silicon layer are about 52 nm and $1 \times 10^{19}$ cm$^{-3}$, respectively. FIG. 3 shows the result of measurement using SIMS carried out after an annealing on the sample for one hour at 800° C.

What is apparent from FIG. 3 is as follows. Since the limit for the measurement of germanium atoms is $10^3$ counts/second and measurements on the order of $10^2$ counts/second can be regarded as background, the maximum penetration of germanium atoms into the first single crystal silicon layer is about 20 nm. Therefore, if the n-type single crystal silicon layer 155 has a thickness of about 50 nm, the penetration of germanium atoms into the n-type diffusion layer 103 can be avoided. Further, according to the results of an experiment carried out by the inventors, increase in leakage current at the p-n junction between the n-type single crystal silicon-germanium alloy layer 116 and the n-type single crystal silicon layer 155 (n-type single crystal silicon layer 115) caused by a crystalline distortion originating from a mismatch of crystalline constants at the interface therebetween can be easily suppressed if the n-type single crystal silicon layer 155 (n-type single crystal silicon layer 115) has a thickness of about 30 nm.

That is, the n-type single crystal silicon layer 155 (n-type single crystal silicon layer 115) of the first embodiment serves as a layer for moderating and absorbing any crystalline distortion at the interface between the n-type single crystal silicon-germanium alloy layer 116 and the n-type single crystal silicon layer 155 (n-type single crystal silicon layer 115). With respect to crystalline distortion of the n-type single crystal silicon-germanium alloy layer 116, the composition of germanium atoms in this layer is preferably 10 atomic % or lower. A composition of germanium atoms exceeding 10 atomic % will result in an increase in crystal defects originating from the n-type single crystal silicon-germanium alloy layer 116, and such crystal defects become more likely to reach the n-type diffusion layer 103 even in the presence of the n-type single crystal silicon layer 155 to increase leakage current at the p-n junction.

Let us focus the description on the diffusion of phosphorus which proceeds as follows. Although phosphorus is thermally diffused from the single crystal silicon-germanium alloy layer (including a high concentration of phosphorus) to the undoped first single crystal silicon layer, the phosphorus impurity concentration of the first single crystal silicon layer stays on the order of $10^{17}$ cm$^{-3}$. Meanwhile, the phosphorus impurity concentration of the second single crystal silicon layer which has been n-type in-situ will not increase. Although each of the n-type single crystal silicon layers 155 and 157 which are the first and second single crystal silicon layers in the first embodiment includes phosphorus on the order of $1 \times 10^{19}$ cm$^{-3}$ in-situ, they will not provide a low-resistance contact plug as they are. Then, according to the present embodiment, phosphorus ions are implanted in a high dose after the formation of the n-type single crystal silicon layer 157, and an annealing serving also as an activating process is performed to convert the n-type single crystal silicon layers 155 and 157 into the n-type single crystal silicon layers 115 and 116, respectively, having an impurity concentration on the order of $1 \times 10^{20}$ $cm^{-3}$, thereby forming a low-resistance contact plug.

Although the above-described first embodiment of the invention has referred to a contact plug formed by a first n-type single crystal silicon layer, an n-type single crystal silicon-germanium alloy layer and a second n-type single crystal silicon layer and a method for manufacturing the same, the present invention is not limited thereto. An n-type polycrystalline silicon layer may be used instead of the second n-type single crystal silicon layer. Further, an n-type polycrystalline silicon layer obtained using selective growth may be used instead of the first n-type single crystal silicon layer. In this case, however, an n-type polycrystalline silicon-germanium alloy layer and a second n-type polycrystalline silicon layer obtained using selective growth are to be used instead of the n-type single crystal silicon-germanium alloy layer and the second n-type single crystal silicon layer, respectively. In addition, the present embodiment may be applied to a contact plug to be used for a p-type diffusion layer. The contact plug in this case will have a layered structure consisting of a p-type first silicon layer, a p-type silicon-germanium alloy layer and a p-type second silicon layer instead of the layered structure consisting of an n-type first silicon layer, an n-type silicon-germanium alloy layer and an n-type second silicon layer.

A second embodiment of the present invention will now be described. The present embodiment is different from the first embodiment in that a first silicon layer, a silicon-germanium alloy layer and a second silicon layer are selectively formed on the surface of a diffusion layer to reduce the aspect ratio of a contact hole effectively. The technique that provides the base of this approach was reported by the inventors on pp. 665–668 (lecture number 27.4.1) on preliminary text IEDM-95 for 1995 International Electron Device Meeting. According to this report, an n-type single crystal silicon layer is formed on the surface of an n-type diffusion layer that forms the source and drain of a DRAM on a self-alignment basis. However, as mentioned in the description of the first embodiment, the maximum impurity concentration of this n-type single crystal silicon layer is only about $10^{19}$ cm$^{-3}$ and it is difficult to increase the impurity concentration to $10^{20}$ cm$^{-3}$ only through phosphorus ion implantation and the like. Thus, it has been difficult to reduce effective contact resistance in connecting the source/drain region constituted by the n-type single crystal silicon layer and the n-type diffusion layer to a bit line or the like. The second embodiment of the invention which is directed to solving this problem is a result of application of the technical concept behind the first embodiment to the contents of the above-mentioned report.

Figure 4A:
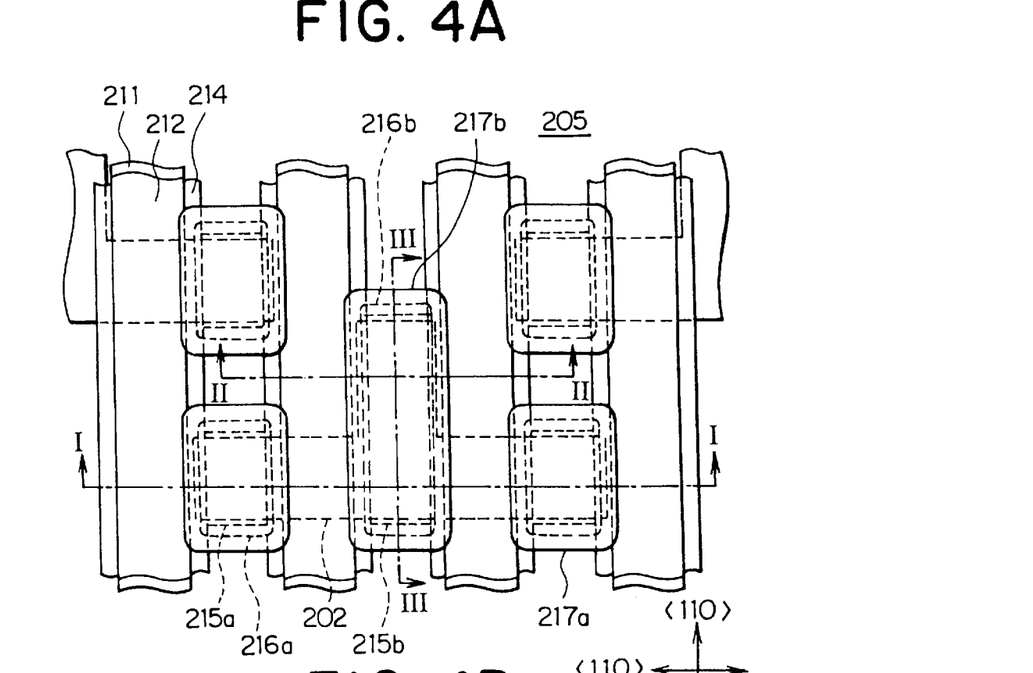
FIGS. 4A and 4B are plan views showing a method for manufacturing a semiconductor device according to a second embodiment of the invention.
Figure 4B:
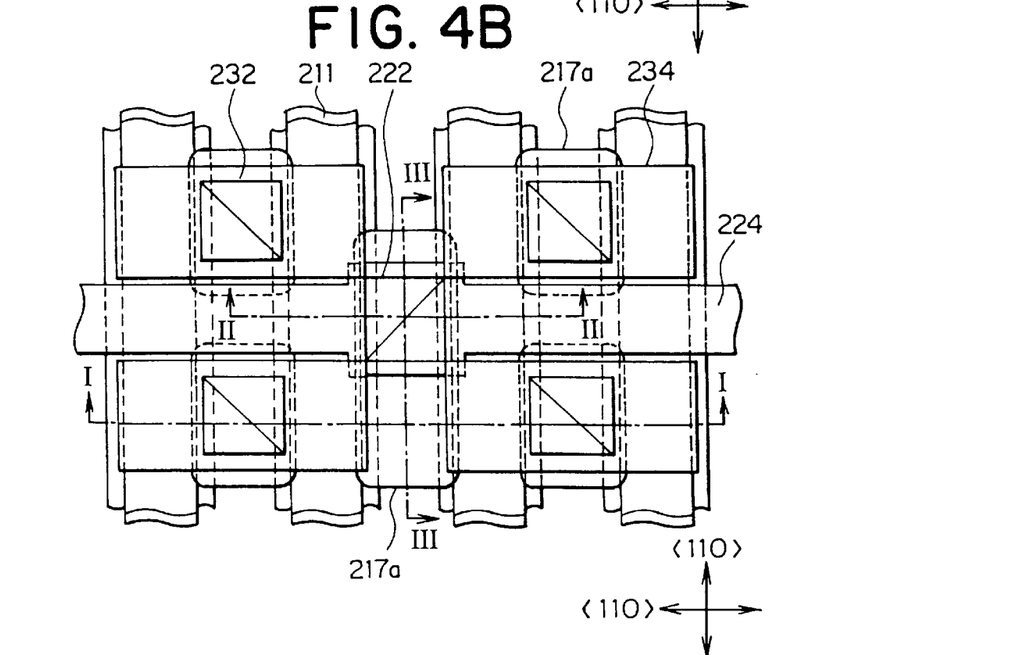
Figures 5A, 5B:
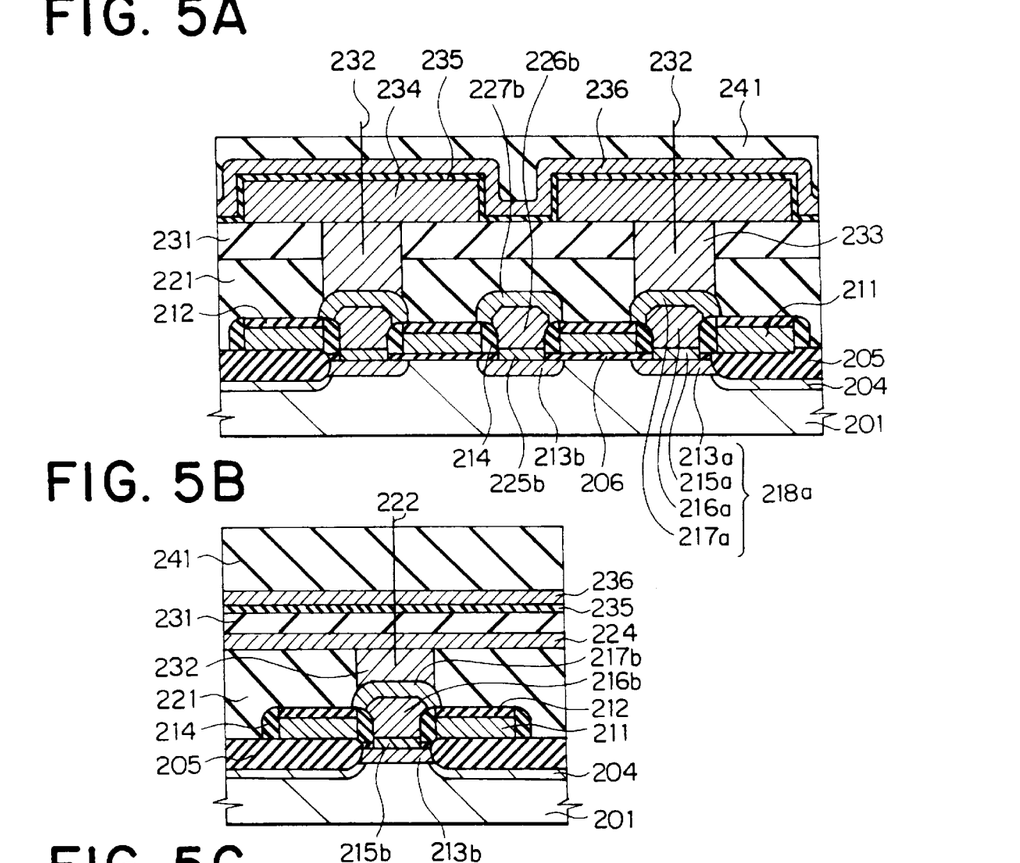
FIGS. 5A, 5B and 5C are sectional views of the second embodiment of the invention taken along the lines I—I, II—II and III—III in FIGS. 4A and 4B, respectively.
Figure 5C:
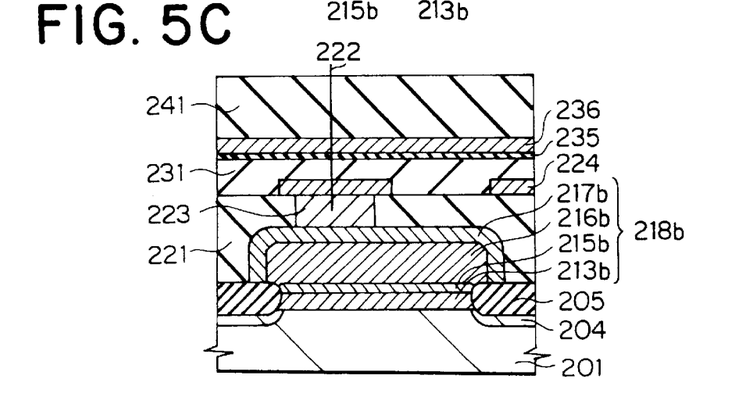

FIGS. 4A and 4B are plan views of a DRAM according to the second embodiment of the invention. FIGS. 5A, 5B and 5C are sectional views taken along the lines I—I, II—II and III—III in FIGS. 4A and 4B, respectively. The present embodiment is a result of application of the invention to a DRAM having a COB structure. The DRAM is formed as follows in accordance with a 0.25 μm design rule. FIGS. 4A and 4B are layered plan views in which FIG. 4A shows positional relationship between active regions, gate electrodes serving also as word lines and second n-type single crystal silicon layer comprising single crystal silicon, and FIG. 4B shows positional relationship between the gate electrodes, the second n-type single crystal silicon layer, bit lines and storage node electrodes. FIGS. 5A, 5B and 5C are sectional views taken along the lines I—I, II—II and III—III in FIGS.4A and 15 4B. For easier understanding of such positional relationships, FIGS. 4A and 4B shows the widths of the gate electrodes and bit lines smaller than the actual proportion.

The main surface of a p-type silicon substrate 201 is a {100}-plane, and the specific resistance of the p-type silicon substrate 201 is on the order of 5Ω·cm. The orientation flat of the silicon wafer on which the p-type silicon substrate 201 is formed is constituted by sides in a <110>-direction. An active region 202 on the surface of the p-type silicon substrate 201 is surrounded by an element separation region which is constituted by a LOCOS type field oxide film 205 having a thickness of about 200 nm and a p-type diffusion layer 204 provided on the bottom of the field oxide film 205 to serve as a channel stopper and a punch through stopper. Such active regions are regularly provided on the main surface of the p-type silicon substrate 201, and the periphery of the active regions 202 are constituted by sides in the <110>-direction. That is, the active regions 202 are defined by sides in the <110>-direction. The minimum width (≈channel width) and the minimum interval of the active regions 202 are both about 0.25 μm. Gate electrodes 211 that also serve as word lines having a thickness of about 150 nm extend across the surface of the active regions 202 through gate oxide films 206 having a thickness of about 8.5 nm provided on the surface of the active regions 202. These gate electrodes 211 are orthogonal to the active regions 202 at least in positions directly above the active regions 202. The width (gate length), intervals and wiring pitch of the gate electrodes 211 are about 0.25 μm, 0.25 μm and 0.5 μm, respectively. The gate electrodes 211 are obtained by stacking a tungsten silicide film having a thickness of about 100 nm on an n-type polycrystalline silicon film having a thickness of about 50 nm.

The upper surface of the gate electrode 211 is directly covered by a silicon oxide film cap 212 having a thickness of about 70 nm. N-type diffusion layers 213a and 213b having a depth of junction of about 100 nm are provided on the surface of the active region 202 in self-alignment with the gate electrode 211 and the field oxide film 205. The sides of the gate electrode 211 and the silicon oxide film cap 212 are directly covered by silicon oxide film spacers 214 having a thickness of about 50 nm. The gate oxide film 206 provided on the surface of the active region 202 is removed by the field oxide film 205 and the silicon oxide film spacers 214 on a self-alignment basis to expose the surface of the n-type diffusion layers 213a and 213b. The width of those exposed surfaces in the direction they are sandwiched by two gate electrodes 211 is about 150 nm, and the width of the exposed surfaces is about 250 nm in the regions thereof sandwiched by the field oxide film 205. Since the height of the upper surface of the silicon oxide film cap 212 from the main surface of the p-type silicon substrate 201 is about 230 nm in a position directly above the active region 202 and is about 320 nm in a position directly above the field oxide film 205, the height of the upper surface of the silicon oxide film cap 212 in a position directly above the active region 202 is about 90 nm lower than the height of the same in a position directly above the field oxide film 205.

The impurity concentration of the n-type diffusion layers 213a and 213b is on the order of $10^{20}$ cm$^{-3}$ at least in the vicinity of the above-described exposed surfaces. Those exposed surfaces are directly covered by n-type single crystal silicon layers 215a and 215b having a height (thickness) of about 10 nm and an impurity concentration on the order of $1\times10^{20}$ cm$^{-3}$. These n-type single crystal silicon layers 215a and 215b to be described later are formed using anisotropic selective epitaxial growth. The upper surfaces of the n-type single crystal silicon layers 215a and 215b are primarily constituted by a {100}-plane in parallel with the main surface of the p-type silicon substrate, and the side surfaces thereof are substantially in direct contact to the surface of the field oxide film 205 or silicon oxide film spacer 214.

The exposed surfaces of the n-type single crystal silicon layers 215a and 215b are directly covered by n-type single crystal silicon-germanium alloy layers 216a and 216b having a thickness of about 250 nm. The impurity concentration of the n-type single crystal silicon-germanium alloy layers 216a and 216b is on the order of $1\times10^{20}$ cm$^{-3}$, and the composition of germanium in them is, for example, about 5 atomic % and is preferably 10 atomic % at the maximum as in the first embodiment. The n-type single crystal silicon-germanium alloy layers 216a and 216b are also formed using anisotropic selective hetero-epitaxial growth, although details of them will be described later. The upper surfaces of the n-type single crystal silicon-germanium alloy layers 216a and 216b are primarily constituted by the {100}-plane in parallel with the main surface of the p-type single crystal silicon substrate 201. The side surfaces of the n-type single crystal silicon-germanium alloy layers 216a and 216b are primarily constituted by a {110}-plane which is perpendicular to the main surface of the p-type silicon substrate and reach the surface of the field oxide film 205 or silicon oxide film spacer 214 and possibly reach the surface of the silicon oxide film cap 212. Since the n-type single crystal silicon layers 215a and 215b having a thickness of about 100 nm are respectively interposed between the n-type single crystal silicon-germanium alloy layers 216a and 216b and the n-type diffusion layers 213a and 213b, the present embodiment suppresses increase in leakage current, for example, at the junction of the n-type diffusion layer 213a even if there is a crystalline distortion at the interface between the n-type single crystal silicon-germanium alloy layer 216a and the n-type single crystal silicon layer 215a as in the first embodiment.

The upper surfaces and side surfaces of the n-type single crystal silicon-germanium alloy layers 216a and 216b are directly n-type single crystal silicon layers 217a and 217b having a thickness of about 50 nm and an impurity concentration on the order of $1\times10^{20}$ cm$^3$, respectively. The n-type single crystal silicon layers 217a and 217b are formed using isotropic selective epitaxial growth, although they are to be detailed later. The n-type single crystal silicon layers 217a and 217b extend on the upper surface of the field oxide film 205, directly cover the oxide silicon film spacer 214 in the vicinity of the upper end thereof, and extend on the upper surface of the silicon oxide film cap 212. The interval between two adjoining n-type single crystal silicon layers 217a is about 50 nm, and the minimum interval between the n-type single crystal silicon layers 217a and n-type single crystal silicon layers 217b is about 100 nm. The present embodiment is not limited to the n-type single crystal silicon layers 217a and 217b and may comprise n-type polycrystalline silicon layers formed using selective growth.

In the present embodiment, a source/drain region 218a is formed by the n-type diffusion layer 213a, n-type single crystal silicon layer 215a, n-type single crystal silicon-germanium alloy layer 216a and n-type single crystal silicon layer 217a. A source/drain region 218b is formed by the n-type diffusion layer 213b, n-type single crystal silicon layer 215b, n-type single crystal silicon-germanium alloy layer 216b and n-type single crystal silicon layer 217b. An n-channel MOS transistor formed on the main surface of the p-type silicon substrate 201 is constituted by the gate oxide film 206, gate electrode 211 and source/drain regions 218a and 218b. Since the interval between two adjoining n-type single crystal silicon layers 217a and the minimum interval between the n-type single crystal silicon layers 217a and n-type single crystal silicon layers 217b are about 50 nm and 100 nm, respectively, insulation and separation between adjoining source/drain regions 218a and between the source/drain regions 218a and 218b is sufficiently maintained.

The p-type silicon substrate 201 including the n-channel MOS transistor is covered by a first interlayer insulator film 221. For example, the interlayer insulator film 221 comprises a silicon oxide type insulator film such as a layered film Bonsisting of a silicon oxide film and a BPSG film obtained by a CVD process and has an upper surface which has been planarized using a chemical mechanical polishing process or the like. The thickness of the interlayer insulator film 221 on the upper surfaces of the n-type single crystal silicon layers 217a and 217b is, for example, about 300 nm. The interlayer insulator film 221 is formed with bit contact holes 222 having a diameter of about 0.25 $\mu$m which extend through the interlayer insulator film 221 to reach the n-type single crystal silicon layer 217. These bit contact holes 222 are filled with contact plugs 223 which are formed, for example, by stacking a titanium film, a titanium nitride film and a tungsten film. Bit lines 224 provided on the upper surface of the interlayer insulator film 221 are directly connected to the contact plugs 223 and are connected to the source/drain regions 218b. For example, the bit lines 224 are constituted by a tungsten silicide film having a thickness of about 120 nm. The minimum line width and the minimum interval of the bit lines 224 are both about 0.25 $\mu$m. The line width of the bit lines 224 at the area of the bit contact holes 222 is about 0.35 $\mu$m. The wiring pitch of the bit lines 224 is about 0.6 $\mu$m.

In the present embodiment, since the width of the n-type single crystal silicon layer 217b in the area thereof reached by the bit contact hole 222 is about 0.45 $\mu$m, the bottom of the bit contact hole 222 is formed solely by the upper surface of the n-type single crystal layer 217b. Thus, those n-type single crystal silicon layers 217b sufficiently serve as contact pads for the bit contact holes 222. Specifically, the bottom of the bit contact hole 222 never directly reaches the silicon oxide film cap 212 or the silicon oxide film spacer 214 and, in addition, the upper surface of the gate electrode 211 will not be exposed at the bottom of the bit contact hole 222. It is therefore possible to easily suppress leakage current and short-circuit between the bit lines 224 and source/drain regions 218b and the gate electrodes 211.

Further, since the bit contact hole 222 reaches the upper surface of the n-type single crystal silicon layer 217b instead of directly reaching the n-type diffusion layer 213b, the aspect ratio of the bit contact hole 222 can be made small. Furthermore, the bit contact hole 222 is shallow, and a low resistance layered film consisting of the n-type single crystal silicon layer 217b, n-type single crystal silicon-germanium alloy layer 216b and n-type single crystal silicon layer 215b intervenes in the electrical connection between the bit line 224 and the n-type diffusion layer 213b. As a result, contact resistance between the bit line 222 and the source/drain region 218b is substantially reduced.

The interlayer insulator film 221 including the bit lines 224 is covered by a second interlayer insulator film 231. The interlayer insulator film 231 is also comprised of a silicon oxide type insulator film. The thickness of the interlayer insulator film 231 on the upper surface of the bit line 224 is about 300 nm, and the upper surface of the interlayer insulator film 231 is also planarized. Node contact holes 232 having a diameter of about 0.25 $\mu$m formed so as to penetrate the interlayer insulator films 231 and 221 reach the n-type single crystal silicon film 215a to be filled with contact plugs 233. The contact plug 233 is mainly comprised of a conductive film obtained by stacking, for example, a titanium film, a titanium nitride film and a tungsten film, and the upper end of the same is covered by, for example, a titanium nitride film. Storage node electrodes 234 provided on the upper surface of the interlayer insulator film 231 are constituted by an n-type polycrystalline silicon film having a thickness of, for example, about 800 nm, directly connected to the contact plugs 233, and connected to the source/drain regions 218a. The interval and the minimum width of the storage node electrodes 234 are about 0.25 $\mu$m and 0.35 $\mu$m, respectively. The upper and side surfaces of the storage node electrodes 234 and at least a part of the interlayer insulator film 231 are directly covered by a capacitive insulator film 235 constituted by an ONO film. The thickness of the capacitive insulator film 235 corresponds to a thickness of about 5 nm of a silicon oxide film. The surface of the capacitive insulator film 235 is directly covered by a cell plate electrode 236 constituted by, for example, an n-type polycrystalline silicon film having a thickness of 150 nm. The surface of the cell plate electrode 236 is directly covered by a surface protection film 241 constituted by, for example, a silicon oxide type insulator film. The thickness of the surface protection film 241 in a position directly above the storage node electrode 234 is about 300 nm.

In the present embodiment, since the width of the n-type single crystal silicon layer 217a in the area thereof reached by the node contact hole 232 is at least about 0.4 $\mu$m, the bottom of the node contact hole 232 is also formed solely by the upper surface of the n-type single crystal layer 217a. Thus, those n-type single crystal silicon layers 217a sufficiently serve as contact pads for the node contact holes 232. It is therefore possible to easily suppress leakage current and short-circuit between the storage node electrodes 234 and source/drain regions 218a and the gate electrodes 211.

Further, since the node contact hole 232 reaches the upper surface of the n-type single crystal silicon layer 217a instead of directly reaching the n-type diffusion layer 213a, the aspect ratio of the node contact hole 232 can be made small. Furthermore, the node contact hole 232 is shallow, and allow resistance layered film consisting of the n-type single crystal silicon layer 217a, n-type single crystal silicon-germanium alloy layer 216a and n-type single crystal silicon layer 215a intervenes in the electrical connection between the storage node electrode 234 and the n-type diffusion layer 213a. As a result, connection resistance between the storage node electrode 234 and the source/drain region 218a is substantially reduced.

FIGS. 5A, 5B and 5C are sectional views taken along the lines I—I, II—II and III—III, respectively. FIGS. 6A through 6E are sectional views taken along the line I—I in FIG. 4. FIG. 7A through 7E are sectional views taken along the line III—III. A description will now be made on a method for manufacturing a DRAM according to the present embodiment will now be described with reference to those drawings and FIG. 8 which illustrates anisotropic selective hetero-epitaxial growth of an n-type single crystal silicon-germanium alloy layer.

Referring to FIGS. 4A, 4B, FIGS. 5A through 5C, FIG. 6A and FIG. 7A, a pad oxide film (not shown) having a thickness of, for example, about 50 μm on a main surface of a p-type silicon substrate 201 constituted by a silicon wafer having a main surface comprising a {100}-plane, specific resistance of about 5Ω·cm and having sides in a <110>-direction, and a silicon nitride film (not shown) is formed so as to cover the pad oxide film. A photoresist film (not shown) is formed on the surface of the silicon nitride film in areas thereof covering only active regions 202 on the main surface of the p-type silicon substrate 201 from directly above. These active regions 202 are defined by sides in a <110>-direction (parallel and perpendicular to the orientation flat) on the main surface if the p-type silicon substrate 201, and each active region 202 is regularly arranged on the main surface of the p-type silicon substrate 201 in a T-shaped configuration. The silicon nitride film is patterned using the photoresist film as a mask and, thereafter, implantation of boron ions on the order of 50 keV and $5 \times 10^{12}$ cm$^{-2}$ is carried out using the photoresist film as a mask. After the photoresist mask is removed, well-known selective oxidization is performed to form a LOCOS type field oxide film 205 having a thickness of about 200 nm and a p-type diffusion layer 204 directly contact to the bottom surface of the field oxide film 205. After the silicon nitride film and pad oxide film are removed, a gate oxide film 206 having a thickness of about 8.5 nm is formed on the surface of the active regions 202 using thermal oxidation.

Figure 6A:
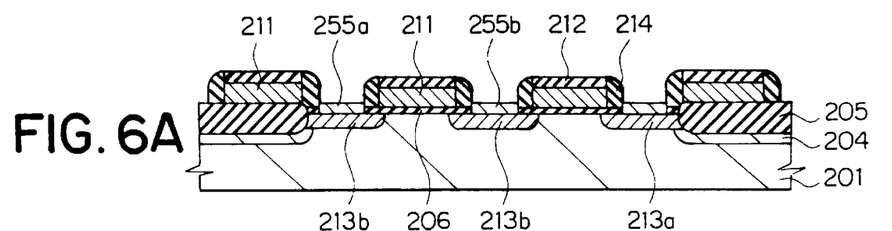
FIGS. 6A through 6E are sectional showing a method of the second embodiment of the invention in the sequential order of the steps, taken along the line I—I in FIGS. 4A and 4B.
Figure 6B:
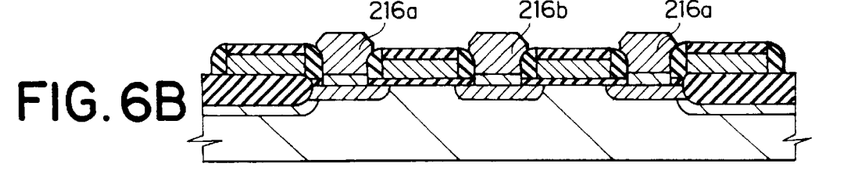
Figure 6C:
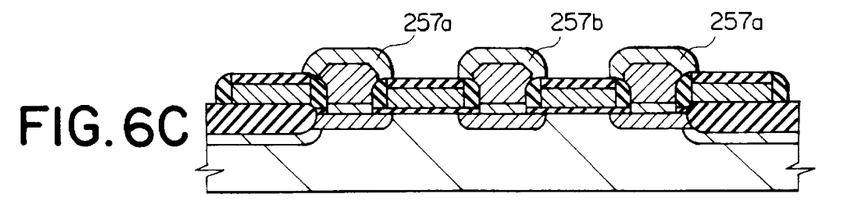
Figure 6D:
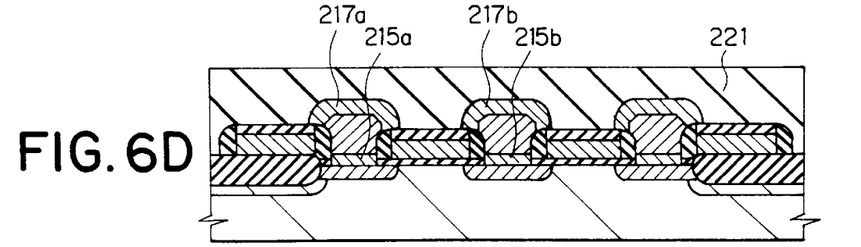
Figure 6E:
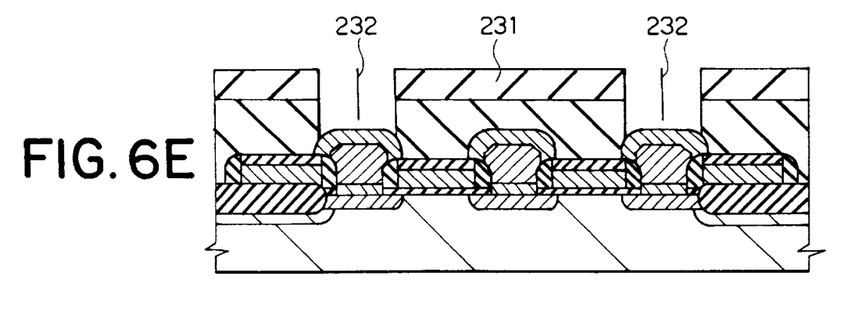
Figure 7A:
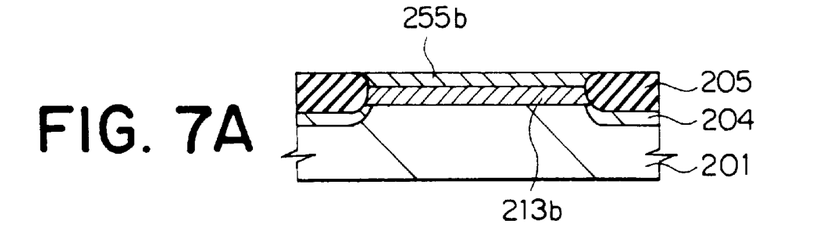
FIGS. 7a through 7E are sectional views showing a method of the second embodiment of the invention in the sequential order of the steps, taken along the line III—III in FIGS. 4A and 4B.
Figure 7B:
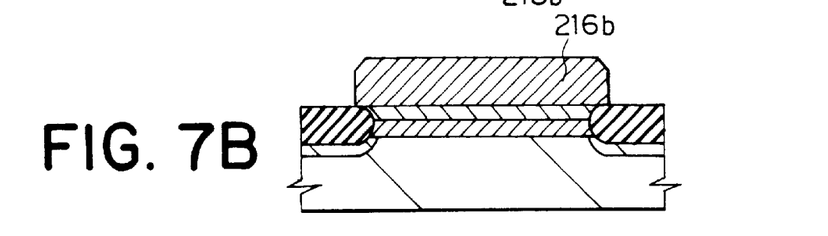
Figure 7C:
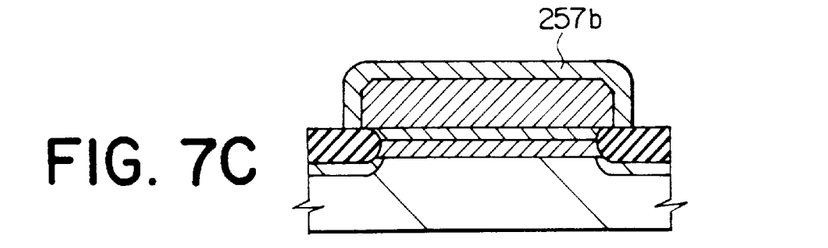
Figure 7D:
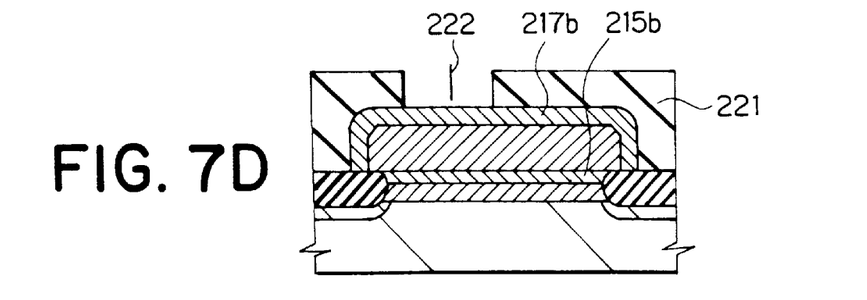
Figure 7E:
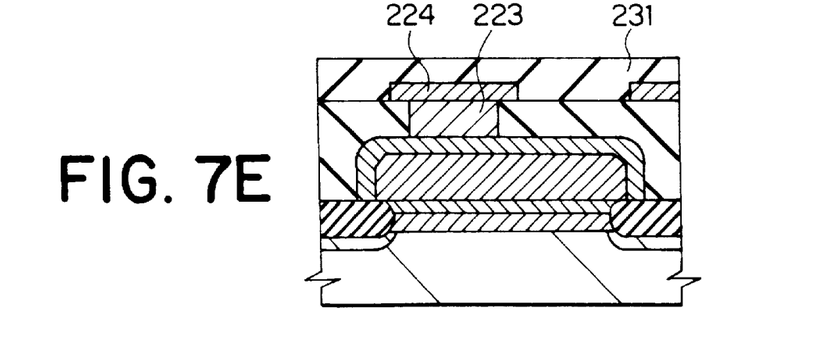

Next, a CVD process is performed at about 700° C. using, for example, dichlorsilane (SiH$_2$Cl$_2$) and phosphine as a raw material gas and a doping gas, respectively, to form an n-type polycrystalline silicon film (not shown) is formed on the entire surface to a thickness of about 50 nm. Further, sputtering is performed to form a tungsten silicide film (not shown) on the entire surface to a thickness of about 100 nm. Furthermore, a silicon oxide film having a thickness of about 100 nm is formed on the entire surface using a CVD process. The silicon oxide film, tungsten silicide film and n-type polycrystalline silicon film are sequentially patterned by means of anisotropic etching to form gate electrodes 211 having a thickness of about 150 nm constituted by a tungsten polycide film (a layered film consisting of an n-type polycrystalline silicon film and a tungsten silicide film) and silicon oxide film caps 212 (having a thickness of about 100 nm) that selectively cover the upper surface of the gate electrodes 211.

For example, implantation of phosphorus ions on the order of 30 keV and $2 \times 10^{13}$ cm$^{-2}$ or the like is carried out to form n-type diffusion layers (not shown) on the surface of the active regions 202 in self-alignment with the field oxide films 205 and gate electrodes 211. The depth of junction of these n-type diffusion layers is about 0.1 μm. Then, a silicon oxide film having a thickness of about 50 nm is formed on the entire surface using CVD. An etch back process is carried out by means of anisotropic etching using a fluorocarbon type etching gas to form silicon oxide spacers 214. In this etch back process, the silicon oxide film caps 212 are also exposed to etching, and the thickness of the silicon oxide film caps 212 is reduced to about 70 nm. Further, the gate oxide film 206 on the surface of n-type diffusion layers 213a and 213b in self-alignment with the silicon oxide film spacers 214 and field oxide films 205 to expose the surface of the n-type diffusion layers in these regions. Subsequently, phosphorus ion implantation in a dose of about $1 \times 10^{16}$ cm$^{-2}$ is carried out to form n-type diffusion layers 213a and 213b whose impurity concentration is on the order of $10^{20}$ cm$^{-3}$ at least in the exposed regions thereof. The interval between adjoining n-type diffusion layers 213a is about 0.35 μm, and the intervals between the n-type diffusion layers 213a and the n-type diffusion layers 213b is about 0.25 μm.

Then, UHV-CVD is used to first remove any native oxide film formed on the exposed surfaces of the n-type diffusion layers 213a and 213b and, thereafter, anisotropic selective epitaxial growth is caused using, for example, disilane at a temperature of 625° C., a pressure on the order of $1 \times 10^{-2}$ Pa and a flow rate of about 2.0 sccm and a doping gas (obtained by diluting 1% phosphine with hydrogen) at a flow rate of about 0.2 sccm to form n-type single crystal silicon layers 255a and 255b (first silicon layers) having a height (thickness) of about 100 nm and an impurity concentration on the order of $1 \times 10^{19}$ cm$^{-3}$ in self-alignment with the exposed surfaces of the n-type diffusion layers 213a and 213b. The sides of the upper surface of these n-type single crystal silicon layers 225a and 225b substantially comprise a <110>-plane. Under the conditions as described above, the rate of growth of the {100}-plane (of the n-type single crystal silicon layers) in the <100>-direction is about 10 nm/min., and the rate of growth of the {110}-plane in the <110>-direction is one-twentieth the growing speed of the {100}-plane in the <100>-direction.

The anisotropic selective epitaxial growth of the first n-type single crystal silicon layers is preferably caused at a substrate temperature in the range from 550° C. to 800° C. and a pressure in the range from $10^{-3}$ Pa to $5 \times 10^{-2}$ Pa. A substrate temperature below 550° C. will not provide n-type single crystal silicon, and a substrate temperature above 800° C. makes it difficult to perform doping of conductive impurities such as phosphorus. Further, a pressure outside the range makes "anisotropic" growth difficult. The "anisotropic" selectivity increases with increase in the substrate temperature and decrease in the flow rate in disilane. Although anisotropic selective epitaxial growth of the n-type single crystal layers can be achieved by using monosilane (SiH$_4$) instead of disilane as a raw material gas, in this case the substrate temperature is shifted upward by about 80 to 100° C. from that for disilane. Anisotropic selective epitaxial growth of the n-type single crystal layers also possible with dichlorsilane as a raw material gas. In this case, however, a problem arises in that a lot of facets are produced.

Referring now to FIGS. 4A, 4B, FIGS. 5A through 5C, FIG. 6B and FIG. 7B, after the n-type single crystal silicon layers 255a and 255b are formed, the above-described UHV-CVD apparatus is used to cause anisotropic selective epitaxial growth, for example, at a substrate temperature of 585° C. and a pressure on the order of $1 \times 10^{-2}$ Pa using disilane at a flow rate of about 10 sccm, monogermane at a flow rate of about 0.5 sccm and a doping gas (obtained by diluting 1% phosphine with hydrogen) at a flow rate of 0.2 sccm. Thus, there is formed n-type single crystal silicon-germanium alloy layers 216a and 216b which selectively cover the n-type single crystal silicon layers 215a and 215b, respectively. The impurity concentration and the thickness of the n-type single crystal silicon-germanium alloy layers 216a and 216b about $1 \times 10^{20}$ cm$^{-3}$ and about 250 nm, respectively. Since the exposed surfaces of the n-type single crystal silicon layers 255a and 255b are substantially constituted by their upper surfaces comprising the {100}-plane and the sides of the upper surfaces of the n-type single crystal silicon layers 255a and 255b substantially in the <110>-direction, the upper surfaces of the n-type single crystal silicon-germanium alloy layers 216a and 216b substantially comprise the {100}-plane which is parallel to the main surface of the p-type silicon substrate 201 and their side surfaces substantially comprise the {100}-plane which is perpendicular to the main surface of the p-type silicon substrate 201.

Figure 8:
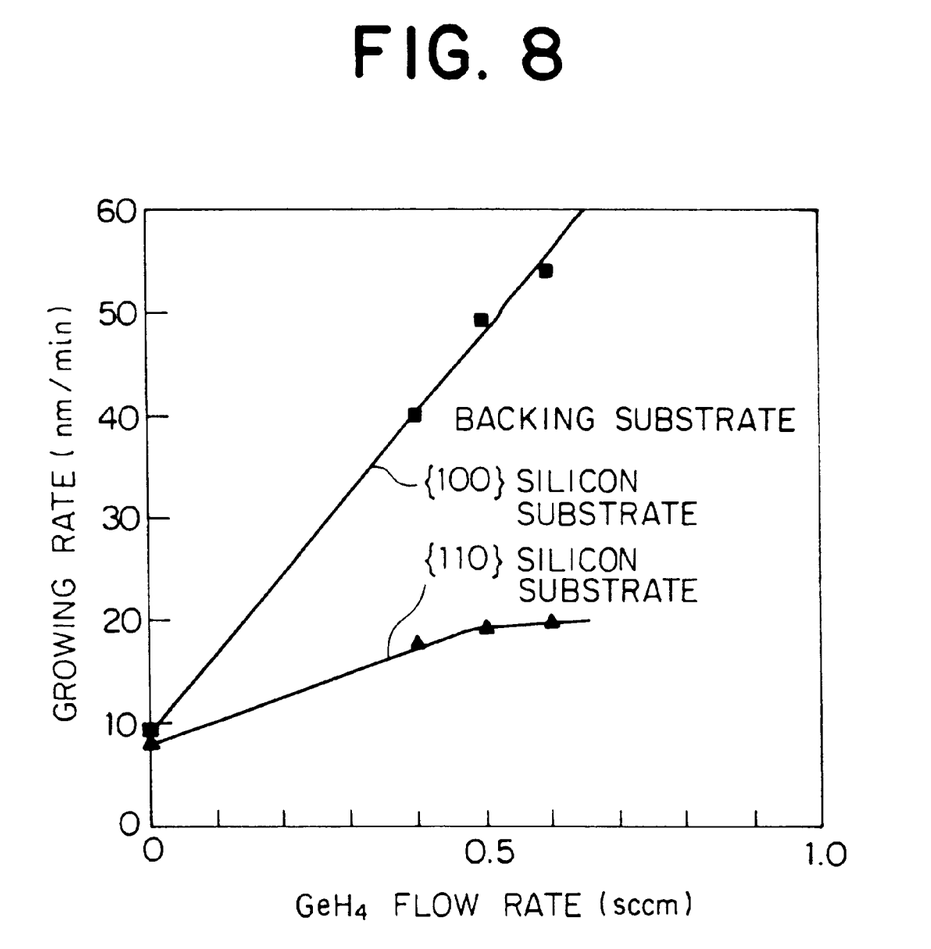
FIG. 8 is a graph showing dependence of selectivity of a crystal growth plane on the flow rate of monogermane in the second embodiment of the invention.

The anisotropism of selective growth is less likely to occur at "low temperatures", e.g., about 585° C. However, when monogermane is added to the raw material gas, anisotropic selective growth can easily take place even at low temperatures. FIG. 8 is a view to support a description on such a tendency. FIG. 8 is a graph showing the tendency of the anisotropism of selective growth relative to the flow rate of monogermane where the substrate temperature is 585° C.; the pressure is $1\times10^{-2}$ Pa: and the flow rate of disilane is 10 sccm. The graph shows the rate of growth of a single crystal silicon-germanium alloy layer which has a surface in parallel with a silicon substrate having a main surface comprising a {100}-plane and another silicon substrate having a main surface comprising a {110}-plane and which grows perpendicularly to those main surfaces.

As apparent from FIG. 8, the ratio of the growing rate the {110}-plane to the growing rate of the {100}-plane decreases as the flow rate (ratio) of monogermane increases. For example, when the monogermane flow rate is 0.5 sccm, the growing rate of the {110}-plane is about 40% of the growing rate of the {100}-plane.

Referring now to FIGS. 4A, 4B, FIGS. 5A through 5C, FIG. 6C and FIG. 7C, after the n-type single crystal silicon-germanium alloy layers 216*a* and 216*b* are formed, the above-described UHV-CVD apparatus is used to cause isotropic selective epitaxial growth, for example, at a substrate temperature of 585° C. and a pressure on the order of $2\times10^{-2}$ Pa using disilane at a flow rate of about 4.0 sccm and a doping gas (comprising hydrogen containing 1% phosphine) at a flow rate of 0.4 sccm. As a result, n-type single crystal silicon layers 257*a* and 257 having a thickness of about 50 nm are selectively formed on the surfaces of the n-type single crystal silicon-germanium alloy layers 216*a* and 216*b*. The impurity concentration of these n-type single crystal silicon layers 257*a* and 257*b* is on the order of $1\times10^{19}$ cm$^{-3}$. Under such condition for growth, the growing rate of the n-type single crystal silicon layer 257*a* equals that of the n-type single crystal silicon layer 255*a*.

When only anisotropic selective hetero-epitaxial growth is employed for the formation of the second silicon layers, the second silicon layers must have a sufficiently large thickness in order for them to be able to cover the silicon oxide film spacers 214. Unless the second silicon layers cover the silicon oxide film spacers 214 completely, there will be a problem associated with the alignment margins for the bit contact holes and the like at the photolithography step. Thus, although anisotropic selective hetero-epitaxial growth may be involved in the formation of the second silicon layers, it is preferable that the formation of those layers is terminated by isotropic selective hetero-epitaxial growth.

Subsequently, phosphorus ion implantation and an annealing are performed under the same conditions as in the first embodiment. The series of processes converts the n-type single crystal silicon layers 255*a* and 255*b* respectively into n-type single crystal silicon layers 215*a* and 215*b* having an impurity concentration on the order of $1\times10^{20}$ cm$^{-3}$ and converts the n-type single crystal silicon layers 257*a* and 257*b* respectively into n-type single crystal silicon layers 217*a* and 217*b* having an impurity concentration on the order of $1\times10^{20}$ cm$^{-3}$. Thus, the source/drain regions 218*a* and 218*b* in the second embodiment are formed.

Like the first embodiment, the second embodiment can be easily applied to manufacturing lines for normal semiconductor devices because the n-type single crystal silicon-germanium alloy layer 216*a* and the like are covered by the n-type single crystal silicon layer 217*a* and the like.

The second embodiment is different from the first embodiment on the following point. According to the second embodiment, the first n-type silicon layers and the n-type silicon-germanium alloy layers are limited to single-crystals obtained through anisotropic selective growth. Meanwhile, the second n-type silicon layers in the second embodiment may be either single-crystals or polycrystals as long as they are selectively grown, which is the same as the first embodiment.

Thereafter, as shown in FIGS. 4A, 4B, FIGS. 5A through 5C, FIG. 6D and FIG. 7D, processes such as formation of an silicon oxide film, formation of a BPSG film, reflow on the BPSG film and CMP are performed to form a first interlayer insulator film 221 comprising a silicon oxide type insulator film having a planar upper surface. Bit contact holes 222 are formed so as to penetrate through the interlayer insulator film 221 to reach the upper surface of the n-type single crystal silicon layer 217*b*. The diameter of those bit contact holes 222 is about 0.25 μm, and the bottom of the bit contact holes 222 does not protrude from the upper surface of the n-type single crystal silicon layer 217*b*.

Next, as shown in FIGS. 4A, 4B, FIGS. 5A through 5C, FIG. 6E and FIG. 7E, the bit contact holes 222 are filled with contact plugs 223. For example, sputtering is performed to form a conductive film constituted by a tungsten silicide film or the like having a thickness of about 120 nm, and the conductive film is patterned to form bit lines 224. Then, a second interlayer insulator film 231 constituted by a silicon oxide type insulator film having a planar upper surface. Node contact holes 232 are formed so as to penetrate through the interlayer insulator film 231 and 221 to reach the upper surface of the n-type single crystal silicon layer 217*a*. The diameter of those node contact holes 232 is also about 0.25 μm, and the bottom of the node contact holes 232 does not protrude from the upper surface of the n-type single crystal silicon layer 217*a*.

Then, the node contact holes 232 are filled with the contact plugs 233. N-type polycrystalline silicon having a thickness of about 800 nm is formed on the entire surface and then is patterned to form storage node electrodes 234. For example, a capacitive insulator film 235 constituted by an ONO film is formed, and cell plate electrodes 236 constituted by 150 nm thick n-type polycrystalline silicon films are formed. Further, a surface protection film 241 is formed to complete a DRAM according to the second embodiment as shown in FIGS. 4A, 4B and FIGS. 5A through 5C.

According to the second embodiment, source/drain regions are formed by stacking first n-type single crystal silicon layers having a high impurity concentration, n-type single crystal silicon-germanium alloy layers having a high impurity concentration and second n-type single crystal silicon layers having a high impurity concentration on the upper surface of an n-type diffusion layer. This facilitates the suppression of leakage current at the junction of the n-type diffusion layer which remains in the first embodiment and makes it possible to reduce the aspect ratios of node contact holes and bit contact holes. In addition, since the single crystal layers thus stacked have low resistance, resistance can be reduced when bit lines or storage node electrodes are connected. The above-described stacked single crystal layers can be provided by forming the first n-type single crystal silicon layers using anisotropic selective epitaxial growth, the n-type single crystal silicon-germanium alloy layers using anisotropic selective hetero-epitaxial growth and the second n-type single crystal silicon layers using isotropic selective hetero-epitaxial growth.

The second embodiment is not limited to the above-described various numerical parameters. The present invention is not limited to the second embodiment and may be applied also to DRAMs having a non-COB structure semiconductor, devices including normal n-channel MOS transistors or semiconductor devices including p-channel MOS transistors.

What is claimed is:

1. A method for manufacturing a semiconductor device having a contact plug comprising the steps of:

forming a diffusion layer of the opposite conductivity type in a predetermined region of a main surface of a silicon substrate of one conductivity type;

forming an insulator film covering the entire surface;

forming a contact hole extending in said insulator film to reach said diffusion layer of the opposite conductivity type;

selectively forming a first silicon layer of the opposite conductivity type on the surface of said diffusion layer of the opposite conductivity type exposed on the bottom of said contact hole in-situ using selective growth;

selectively forming a silicon-germanium alloy layer of the opposite conductivity type in-situ on the upper surface of said first silicon layer in said contact hole using selective growth;

selectively forming a second silicon layer of the opposite conductivity type in-situ on the upper surface of said silicon-germanium alloy layer in said contact hole using selective growth; and forming wiring directly contact to the upper surface of said second silicon layer on a surface of said insulator film.

2. The method for manufacturing a semiconductor device according to claim 1, wherein the selective growth of said first silicon layer is selective epitaxial growth and the selective growth of said silicon-germanium alloy layer is selective hetero-epitaxial growth.

3. The method for manufacturing a semiconductor device according to claim 2, wherein the selective growth of said second silicon layer is selective hetero-epitaxial growth.

4. The method for manufacturing a semiconductor device according to claim 1, further comprising the step of performing high concentration ion implantation of an impurity of the opposite conductivity type on the surface of said diffusion layer of the opposite conductivity type exposed on the bottom of said contact hole using said insulator film as a mask after said contact hole is formed.

5. The method for manufacturing a semiconductor device according to claim 4, further comprising the step of performing high concentration ion implantation of an impurity of the opposite conductivity type and annealing after said second silicon layer is formed.

6. A method for manufacturing a semiconductor device having a contact plug comprising the steps of:

forming a field oxide film in an element separation region surrounding an active region defined by sides in a <100>-direction on a main surface of a {100} plane of a silicon substrate of one conductivity type;

forming a gate oxide film on the surface of said active region using thermal oxidation;

forming a conductive film on the gate oxide film;

forming a silicon oxide film cap directly covering an upper surface of said conductive film;

patterning said silicon oxide film cap and conductive film to form a gate electrode extending across the surface of said active region in the <110>-direction through said gate oxide film;

forming a diffusion layer of the opposite conductivity type on the surface of said active layer using said gate electrode and said field oxide film as a mask;

forming a second silicon oxide film on the entire surface;

etching back said second silicon oxide film by anisotropic etching to form a silicon oxide film spacer directly covering sides of said silicon oxide film cap and gate electrode;

removing said gate oxide film in self-alignment with said silicon oxide film spacer and field oxide film;

forming a first silicon layer of the opposite conductivity type in situ on the surface of said diffusion layer of the opposite conductivity type using anisotropic selective epitaxial growth of single crystal silicon;

forming a silicon-germanium alloy layer of the opposite conductivity type in-situ directly covering at least the upper surface of said first silicon layer using anisotropic selective hetero-epitaxial growth of single crystal silicon-germanium;

forming a second silicon layer of the opposite conductivity type in situ directly covering at least the upper surface and side surface of said silicon-germanium alloy layer using isotropic selective hetero-epitaxial growth of single crystal silicon or selective growth of polycrystalline silicon; and forming an interlayer insulator film on the entire surface, forming a contact hole extending in said interlayer insulator film to reach said second silicon layer;

forming wiring on the surface of said interlayer insulator film in connection to said second silicon layer through said contact hole.

7. The method of manufacturing a semiconductor device according to claim 6 wherein the anisotropic selective epitaxial growth of said silicon-germanium layer is caused by using disilane or monosilane and monogermane ($GeH_4$) as main raw material gases.

* * * * *